United States Patent [19]

Higashi et al.

[11] Patent Number: 4,739,384
[45] Date of Patent: Apr. 19, 1988

[54] SOLID-STATE IMAGING DEVICE WITH POLYCRYSTALLINE FILM

[75] Inventors: Akio Higashi; Haruji Shinada; Kazuhiro Kawajiri, all of Kanagawa, Japan

[73] Assignee: Fuji Photo Film Co., Ltd., Kanagawa, Japan

[21] Appl. No.: 790,014

[22] Filed: Oct. 22, 1985

[30] Foreign Application Priority Data

Oct. 22, 1984 [JP] Japan .............................. 59-220545

[51] Int. Cl.$^4$ ............................................. H01L 27/14
[52] U.S. Cl. ........................................ 357/30; 357/59; 357/31; 357/32; 357/24
[58] Field of Search ............... 357/30 K, 30 G, 30 H, 357/30 I, 30 L, 59 B, 59 C, 59 D, 59 E, 59 F, 31, 32, 24 LR, 23, 11

[56] References Cited

U.S. PATENT DOCUMENTS

| | | | |
|---|---|---|---|
| 4,323,912 | 4/1982 | Koike et al. | 357/31 |
| 4,581,620 | 4/1986 | Yamazaki et al. | 357/30 K X |
| 4,589,003 | 5/1986 | Yamada et al. | 357/31 X |
| 4,620,058 | 10/1986 | Winterling et al. | 357/30 K X |

Primary Examiner—Andrew J. James
Assistant Examiner—William A. Mintel
Attorney, Agent, or Firm—Sughrue, Mion, Zinn, Macpeak & Seas

[57] ABSTRACT

A solid-state imaging device in which the possibility of defect formation in a photoconductive layer is substantially eliminated by the use of a multi-layered structure. A photoconductive film unit and a transparent electrode are formed in that order on a semiconductor substrate in which is formed a scanning circuit composed of a plurality of picture elements defined by respective electrodes on the semiconductor substrate and the transparent electrode. The photoconductive film unit is composed of a polycrystalline silicon film and an amorphous silicon film that are disposed in that order on the semiconductor substrate.

5 Claims, 1 Drawing Sheet

SOLID-STATE IMAGING DEVICE WITH POLYCRYSTALLINE FILM

BACKGROUND OF THE INVENTION

The present invention relates to a solid-state imaging device having a multi-layered scanning circuit and photoconductive film formed on a semiconductor substrate.

In order to obtain a high photosensitivity, a conventional solid-state imaging device with a multilayered structure employs a photoconductive film of amorphous silicon formed on a scanning circuit substrate of either the MOS, CCD or BBD type. One problem with this structure is the high possibility of defects such as voids or cracks developing in the amorphous silicon film where steps occur at the electrode edges or contact holes in the substrate. If any of these defects remain unremoved after the photoconductive film is separated into individual picture elements (pixels), the areas that correspond to such defects are selectively etched faster than the other areas or leakage currents will flow in the residual defects, thereby causing considerable degradation of the device characteristics.

In order to prevent the occurrence of such defects, a substrate having a very high degree of surface flatness must be used. However, this requires highly sophisticated production techniques and results in a higher cost because of the increased number of process steps.

The thin amorphous silicon film is usually formed by a plasma-assisted CVD technique using glow discharge. Dust particles or other foreign material in the CVD equipment often cause pinholes and other defects in the amorphous silicon film and introduce nonuniformities in the quality of the film, not only with respect to a single wafer, but also between individual wafers. These problems taken together present a barrier against the manufacturing of solid-state imaging devices of the multi-layered structure with higher yields.

SUMMARY OF THE INVENTION

The primary object, therefore, of the present invention is to provide a solid-state imaging device that eliminates the chance of defect formation in the photoconductive film by using a multi-layered structure of an appropriate material.

Accordingly, the invention provides a solid-state imaging device wherein a photoconductive film unit and a transparent electrode are disposed in that order on a semiconductor substrate in which has been formed a scanning circuit composed of a plurality of picture elements, the picture elements being defined by a plurality of electrodes on the semiconductor substrate and transparent electrode. In accordance with the invention, the photoconductive film unit is formed of a polycrystalline silicon film and an amorphous silicon film disposed in that order on the semiconductor substrate.

DESCRIPTION OF THE PREFERRED EMBODIMENTS

Figure 1:
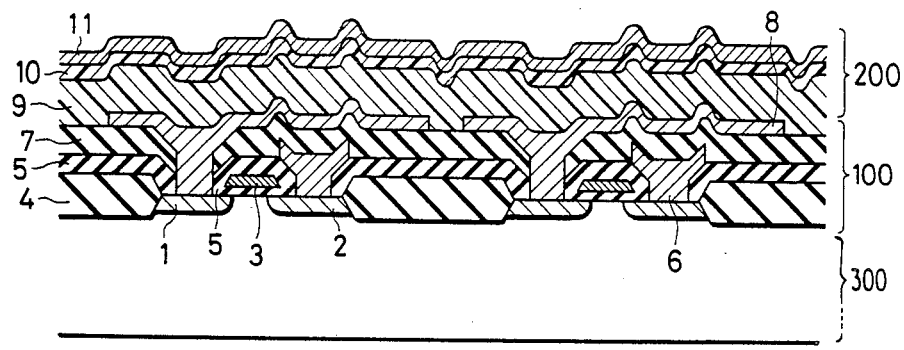
FIG. 1 shows a cross section of a solid-state imaging device in accordance with a preferred embodiment of the present invention.

A solid-state imaging device according to a preferred embodiment of the present invention is shown in FIG. 1 wherein the scanning circuit, formed on a semiconductor substrate 300, and the photoconductive film unit are generally indicated at 100 and 200, respectively. The scanning circuit, 100 may be implemented in any of the known device forms such as MOS, CCD or BBD The following description assumes that the scanning circuit 100 is implemented with MOS-type devices.

Specifically, the scanning circuit 100 has a plurality of MOS field-effect transistors, each having a source 1, a drain 2 and a gate 3. The individual transistors are isolated from each other by an insulating $SiO_2$ layer 4. The gate 3 is buried within an insulating layer 5 made of PSG (phosphorus silicate glass) or $SiO_2$. A read electrode 6 is connected to the drain 2 and covered with an interlayer insulator 7 made of either PSG or $SiO_2$. On the insulator 7 lies an electrode 8 that is connected to the source 1 and defines a single picture element.

The photoconductive film unit 200 is formed on the scanning circuit 100 with the electrode 8 serving as a light-sensing electrode. In accordance with the invention, a poly Si (polycrystalline silicon) film 9 having good step coverage is first disposed on the electrode 8 and is overlaid in sequence with an amorphous silicon film 10 and a transparent electrode 11.

The poly Si film 9 may be formed by a CVD technique at temperatures between 600° and 800° C. Therefore, the electrode 8 should be made of a material that withstands high temperatures in the range of 600° to 800° C. such as a metal silicide MSiX (where M is a transition metal such as Mo, W, Ti, Cr and Ta) or a metallic element such as Mo or Ti. Aluminum should not be used as the material of the electrode 8. The poly Si film 9, which is undoped, is of the negative conduction type, but it may be rendered intrinsic by doping with boron (B). The thickness of the film 9 preferably ranges from 0.1 to 0.5 microns. The amorphous silicon film 10 is of either the p or p+ type.

The poly Si film 9 has such a good step coverage that no defect capable of degrading the characteristics of the device develop in the film 9 in areas corresponding to the steps formed in the electrode 8. Polycrystalline silicon films generally have low resistivities (on the order of 10 to 100 ohm-cm) and are highly likely to cause degraded image resolution because of the mixing of colors or signal crosstalk between picture elements. In the embodiment shown in FIG. 1, this problem is avoided by reducing the thickness of the poly Si film 9 to as little as 0.5 microns or less so that it is formed as a continuous photoconductive layer that is not interrupted between picture elements.

Figure 2:
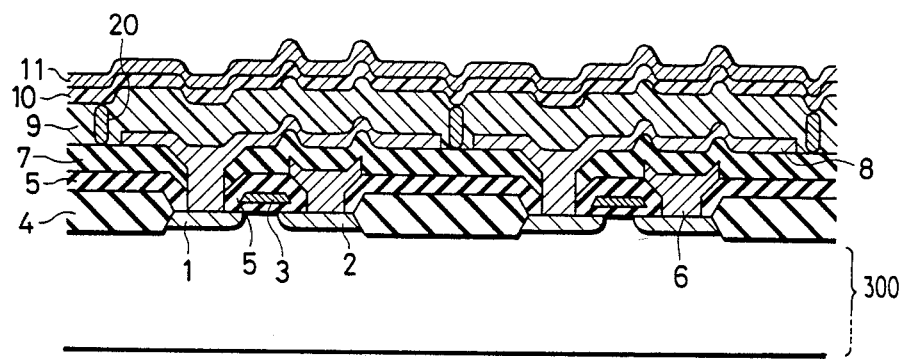
FIG. 2 shows a cross section of a device according to another embodiment of the invention.

FIG. 2 shows another embodiment of the solid-state imaging device of the invention wherein a channel stopper is provided in the photoconductive film between picture elements in order to ensure more reliable isolation between picture elements. As shown in FIG. 2, a channel stopper 20 of the p+ type is buried in the poly Si film 9 between picture elements. The process for making this channel stopper 20 may proceed as follows: First, the poly Si film 9 with a uniform thickness of about 0.1 to 5 microns is formed on the substrate electrode 8, and a resist pattern corresponding to the intended pixel areas is deposited on the film 9. Ions of boron or other group III atoms are selectively injected into the film 9 so as to form a p+ region between pixels. After activating the thus-formed p+ region by annealing between 600° and 900° C., an amorphous silicon film 10 with an approximate thickness of 50 to 500 Å is deposited on the poly Si film 9, which is overlaid with an ITO film serving as the transparent electrode 11. In the illustrated embodiment, the poly Si film 9 has a thickness ranging from 0.1 to 5 microns, but it exhibits good step coverage since no defects will develop in the temperature range for the deposition of the amorphous silicon film 10. Furthermore, the amorphous silicon film 10 formed on the poly Si film has a small thickness (of the order of 50 to 500 Å) and is substantially free from any defects.

Figure 3:
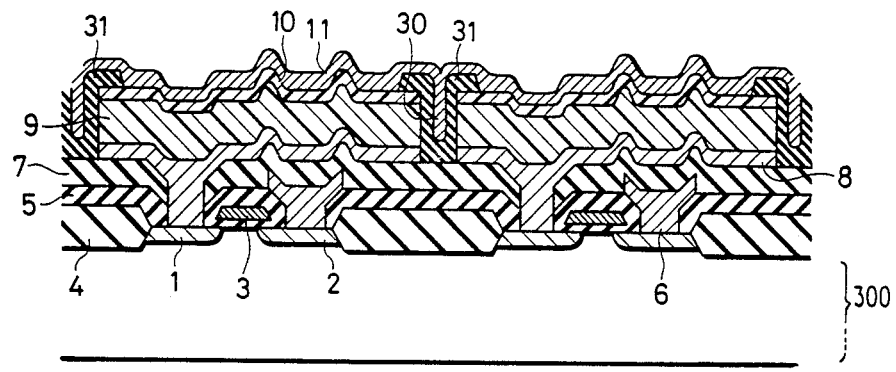
FIG. 3 shows a cross section of a device according to still another embodiment of the invention.

Another embodiment that ensures reliable isolation of picture elements is shown in FIG. 3. In this embodiment, after the poly Si film 9 and amorphous Si film 10 are disposed on the substrate electrode 8, the two films are etched in areas between picture elements so as to form grooves 30 which are filled with an insulating material 31 made from $Si_3N_4$ or $SiO_2$ by suitable techniques such film deposition by CVD or plasma-assisted CVD methods and thermal oxidation. The amorphous Si film 10 is then overlaid with the transparent electrode 11. The illustrated embodiment ensures substantially perfect isolation between pixels by filling the grooves 30 with insulating material 31. As in the embodiment shown in FIG. 2, the amorphous Si film 10 is substantially free from bulk defects.

As described in the foregoing, the solid-state imaging device of the present invention does not have an amorphous silicon film directly formed on the light-sensing electrodes. Instead, a poly Si film having good step coverage is first formed on the light-sensing electrodes electrode, and thereafter the amorphous silicon film is formed on that poly Si film. Because of this layer arrangement, no defects that could cause degradation of the device characteristics develop in the poly Si or amorphous Si film in areas that correspond to the steps in the light-sensing electrodes. Furthermore, the formation of poly Si films involves less generation of dust or flakes than that of amorphous Si films, hence contributing to the production of reliable devices with higher yields.

What is claimed is:

1. A solid-state imaging device comprising: a semiconductor substrate; a scanning circuit comprising a plurality of picture elements formed on a surface of said substrate, each of said picture elements comprising a light-sensing electrode and semiconductor switching means coupled to said light-sensing electrode; a polycrystalline silicon film extending continuously over said light-sensing electrodes of said scanning circuit, said polycrystalline film having a resistance in a direction parallel to said surface of said substrate sufficiently high as to prevent crosstalk between adjacent ones of said picture elements; an amorphous silicon film formed over said polycrystalline silicon film, said polycrystalline film being sufficiently thick to prevent formation of defects in said amorphous silicon film; and a transparent electrode formed over said amorphous silicon film.

2. The solid-state imaging device according to claim 1, wherein said polycrystalline silicon film has a thickness of 0.1 to 0.5 microns.

3. The solid-state imaging device according to claim 1, wherein said polycrystalline silicon film has a conductivity type and a thickness of 0.1 to 5 microns, and further comprising channel stopper regions of a different conductivity type from said polycrystalline film formed in said polycrystalline film between said picture elements.

4. The solid-state imaging device according to claim 1, wherein said polycrystalline silicon film has a thickness of 0.1 to 0.5 microns, and a groove is formed in said polycrystalline silicon film between picture elements.

5. The solid-state imaging device according to claim 4, wherein said trench is filled with an insulating material.

* * * * *